(12) United States Patent
Chen et al.

(10) Patent No.: US 7,397,663 B2
(45) Date of Patent: Jul. 8, 2008

(54) CLIP FOR HEAT DISSIPATION DEVICE

(75) Inventors: Chun-Chi Chen, Tu-Cheng (TW);
Shi-Wen Zhou, Shenzhen (CN); Guo Chen, Shenzhen (CN); Zhan Wu, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 56 days.

(21) Appl. No.: 11/309,345

(22) Filed: Jul. 28, 2006

(65) Prior Publication Data
US 2008/0024986 A1   Jan. 31, 2008

(51) Int. Cl.
*H05K 7/20* (2006.01)
(52) U.S. Cl. ............... 361/704; 361/695; 361/697; 257/718; 257/719; 257/727; 165/80.3
(58) Field of Classification Search ............ None
See application file for complete search history.

(56) References Cited

U.S. PATENT DOCUMENTS

| | | | | |
|---|---|---|---|---|
| 5,671,118 A | * | 9/1997 | Blomquist | 361/704 |
| 5,933,326 A | | 8/1999 | Lee et al. | |
| 6,318,452 B1 | * | 11/2001 | Lee | 165/80.3 |
| 6,501,656 B1 | * | 12/2002 | Peng et al. | 361/703 |
| 7,061,764 B2 | * | 6/2006 | Lai et al. | 361/704 |
| 7,190,584 B2 | * | 3/2007 | Lee et al. | 361/703 |
| 7,280,361 B1 | * | 10/2007 | Lin | 361/704 |
| 7,292,442 B2 | * | 11/2007 | Yu et al. | 361/704 |

* cited by examiner

*Primary Examiner*—Boris L Chervinsky

(57) ABSTRACT

A clip includes a body, an actuating member, a first hook plate and a second hook plate. The body includes a supporting portion and a pair of spaced arms extending from opposite sides of the supporting portion. The actuating member includes a cam supported on the supporting portion. The first hook plate is detachably coupled to a distal end of the arms of the body. The second hook plate extends through the supporting portion and is pivotally coupled to the cam of the actuating member. The actuating member is turnable relative to the second hook plate between a locked position and an unlocked position.

13 Claims, 8 Drawing Sheets

CLIP FOR HEAT DISSIPATION DEVICE

FIELD OF THE INVENTION

The present invention relates to a clip for a heat dissipation device, more particularly to a clip which can readily and securely attach a pre-assembled heat dissipation device to an electronic device.

DESCRIPTION OF RELATED ART

A heat dissipation device is usually placed in thermal contact with an electronic package, such as a central processing unit (CPU), and transfers heat through conduction away from the electronic package to prevent over-heating of the electronic package. Usually a heat dissipation device is secured to an electronic package by a clip.

Referring to FIG. 8, a clip 10 in accordance with related art secures a heat dissipation device 20 to a CPU module 30 fitting into a socket board 40. The heat dissipation device 20 comprises a heat sink 22 and a fan 24 mounted on an upper side of the heat sink 22. The clip 10 comprises a body 12 abutting against the heat sink 22 and a pair of legs 14 formed at opposite ends of the body 12. Each leg 14 comprises a hook hole 16 defined therein for engaging with a corresponding catch 42 of the socket board 40 so as to secure the heat dissipation device 20 to the CPU module 30.

However, the clip 10 is a single unit, and the legs 14 are integrated formed with the body 12. This causes several questions. First, when installing the clip 10 into the heat dissipation device 20, the clip 10 is first placed onto the heat sink 22 from the upper side of the heat sink 22, prior to the fan 24 being mounted on the upper side of the heat sink 22. Second, when removing the clip 10 from the heat dissipation device 20, the fan 24 should be first removed away from the heat sink 22 so that the clip 10 can be removed away from the upper side of the heat sink 22. Therefore, it is troubling and time-consuming to install or remove the clip 10. In addition, a relatively large force is required to operate the clip 10 for securing the heat dissipation device 20 to the CPU module 30. This makes it difficult to attach and detach the clip 10 from the socket board 40.

SUMMARY OF THE INVENTION

A clip comprises a body, an actuating member, a first hook plate and a second hook plate. The body comprises a supporting portion and a pair of spaced arms extending from opposite sides of the supporting portion. The actuating member comprises a cam supported on the supporting portion. The first hook plate is detachably coupled to a distal end of the arms of the body. The second hook plate extends through the supporting portion and is pivotally coupled to the cam of the actuating member. The actuating member is turnable relative to the second hook plate between a locked position and an unlocked position.

Other advantages and novel features will become more apparent from the following detailed description of preferred embodiments when taken in conjunction with the accompanying drawings, in which:

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
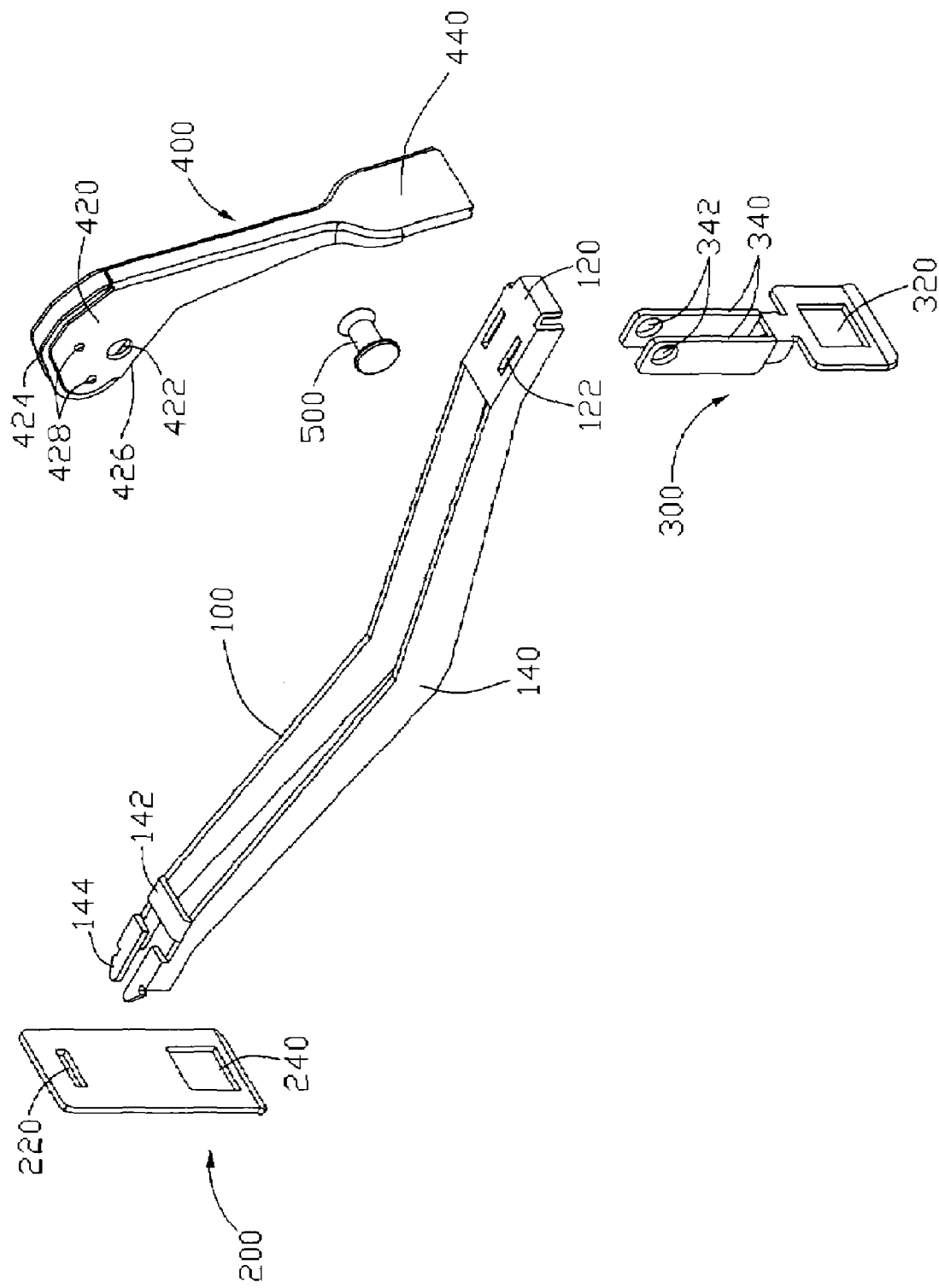
FIG. 1 is an exploded view of a clip in accordance with a preferred embodiment of the present invention.
Figure 2:
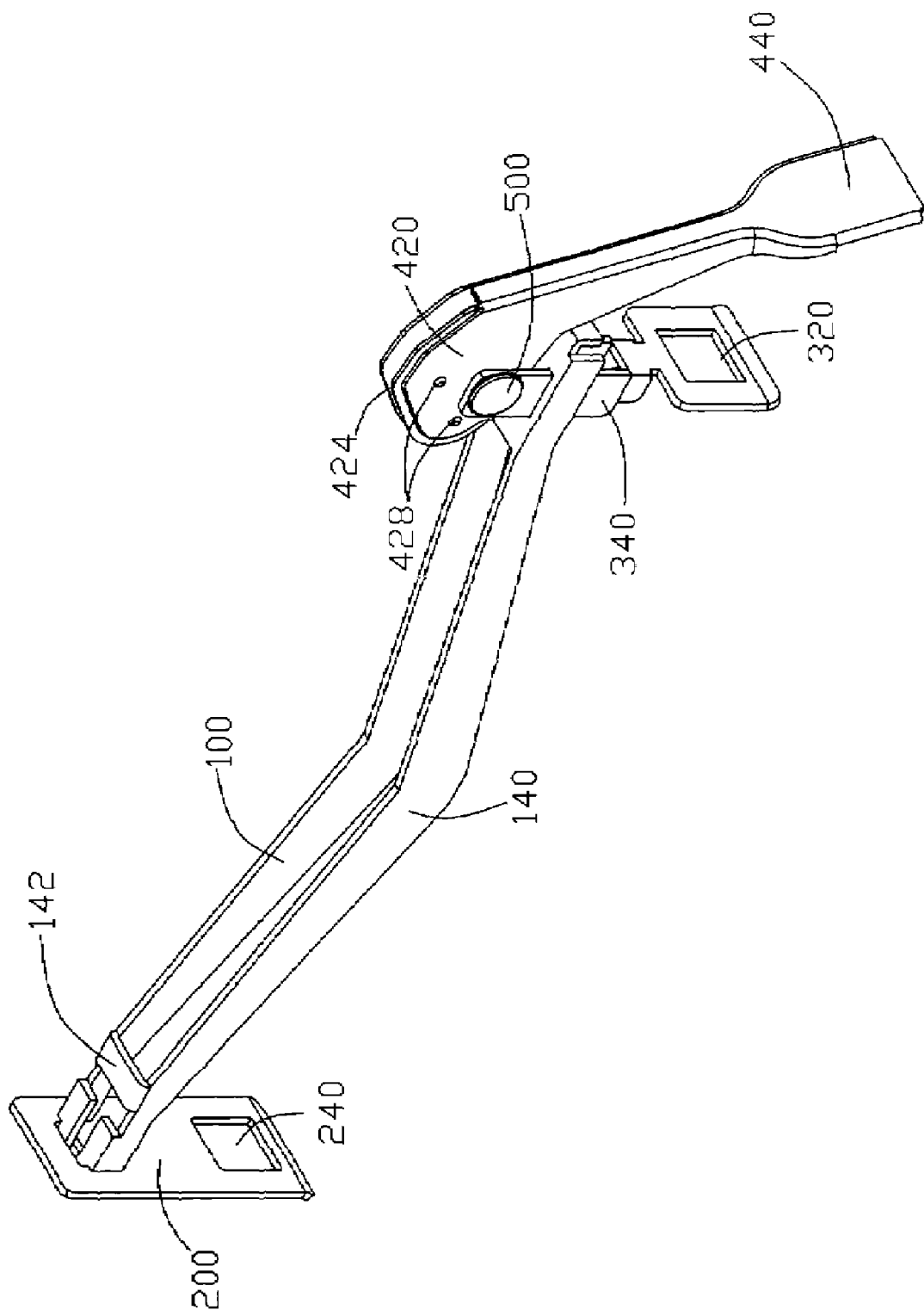
FIG. 2 is an assembly view of the clip in FIG. 1.
Figure 3:
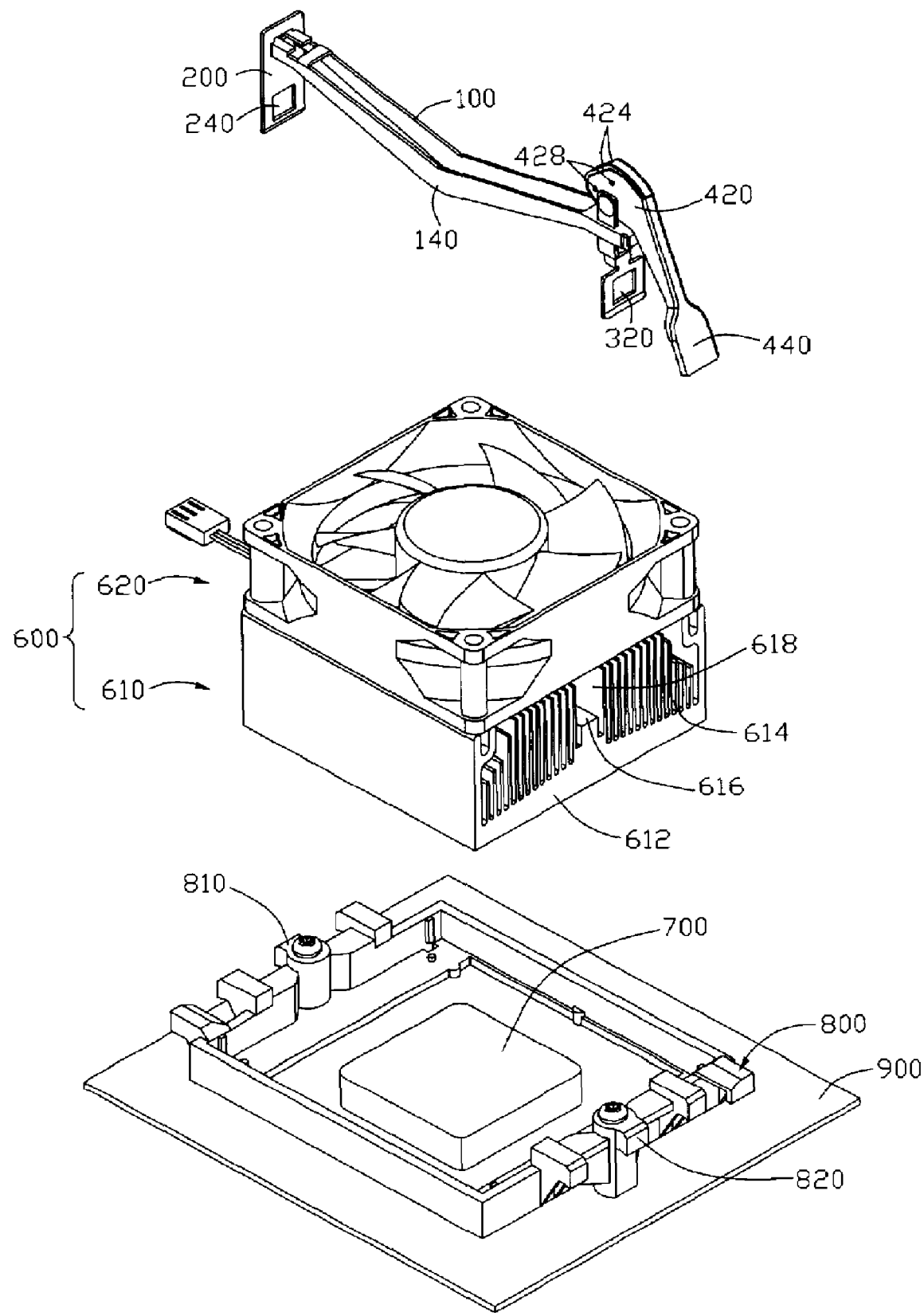
FIG. 3 is an exploded view of the clip securing a heat dissipation device onto an electronic package.

Referring to FIGS. 1-2, a clip in accordance with a preferred embodiment of the present invention is illustrated. The clip is used to secure a heat sink to an electronic package; it comprises an elongated body 100, a first hook plate 200, a second hook plate 300, and an actuating member 400.

The body 100 comprises a flat supporting portion 120 and a pair of spaced V-shaped arms 140 extending from opposite sides of the supporting portion 120. A pair of spaced slots 122 are defined through the supporting portion 120, and extend along a direction substantially in line with the two arms 140. A bridge 142 is formed at the arms 140 adjacent a free end of the body 100 distant from the supporting portion 120. The bridge 142 interconnects the arms 140 to reinforce the strength of the body 100. Each arm 140 has a barb 144 formed at the free end of the body 100 for engaging with the first hook plate 200 to fasten the body 100 to the first hook plate 200.

The first hook plate 200 is a flat plate member having a retaining hole 220 and a hook hole 240 being respectively defined in opposite top and bottom sides thereof. The retaining hole 220 is used to receive and engage with the barbs 144 of the body 100 thus coupling the first hook plate 200 to the body 100. The hook hole 240 is for receiving a locking member set on one side of the electronic package.

The second hook plate 300 defines a hook hole 320 corresponding to and engaging with another locking member set on another side of the electronic package. A pair of spaced legs 340 upwardly extend from opposite sides of the second hook plate 300, and each leg 340 has a pivot hole 342 defined in a top part thereof to receive a pivot 500. The legs 340 can extend upwards through the slots 122 of the supporting portion 120 of the body 100, and position the pivot hole 342 above the supporting portion 120 so as to engage with the actuating member 400 via the pivot 500.

The actuating member 400 comprises a cam 420 supported on the supporting portion 120 and a handle lever 440 extending from an end of the cam 420. A pivot hole 422 extends through the cam 420 corresponding to the pivot holes 342 of the second hook plate 300. The cam 420 comprises an engagement portion 424 and a release portion 426 in the periphery. The distance between the pivot hole 422 and the engagement portion 424 is greater than the distance between the pivot hole 422 and the release portion 426. There are two spaced nubs 428 projecting outward from one side of the cam 420, and the distance between the two nubs 428 is not less than the width of each of the legs 340 of the second hook plate 300.

When the legs 340 of the second hook plate 300 are inserted from bottom side to upside through the slots 122 of the supporting portion 120, the cam 420 of the actuating member 400 is then positioned between the legs 340 of the second hook plate 300 with the pivot hole 422 of the cam 420 in line with the pivot holes 342 of the legs 340 of the second hook plate 300. The pivot 500 is then fastened to the pivot hole 422 of the actuating member 400 and the pivot holes 342 of the second hook plate 300 to pivotally secure the actuating member 400 to the second hook plate 300. When assembled, the user can turn the actuating member 400 about the pivot 500 relative to the second hook plate 300 between a first position, namely, the locked position where the engagement portion 424 is maintained in close contact with the supporting portion 120 of the body 100, and a second position, namely, the unlocked position where the release portion 426 is maintained in close contact with the supporting portion 120 of the body 100.

Referring to FIGS. 3-6, the aforesaid clip is adopted to attach a heat dissipation device, particularly a pre-assembled heat dissipation device 600 on a top surface of an electronic package such as a CPU module 700 fitting in a retention module 800 on a motherboard 900. The heat dissipation device 600 comprises a heat sink 610 and a fan 620 mounted on an upper side of the heat sink 610. The heat sink 610 comprises a base 612 in thermal contact with the CPU module 700 and a plurality of fins 614 on the top surface of the base 612. A locating structure such as a locating protrusion 616 protrudes upwardly from the top surface of the base 612 and is lower than adjacent fins 614 so as to form a passage 618 under the fan 620.

Figure 4:
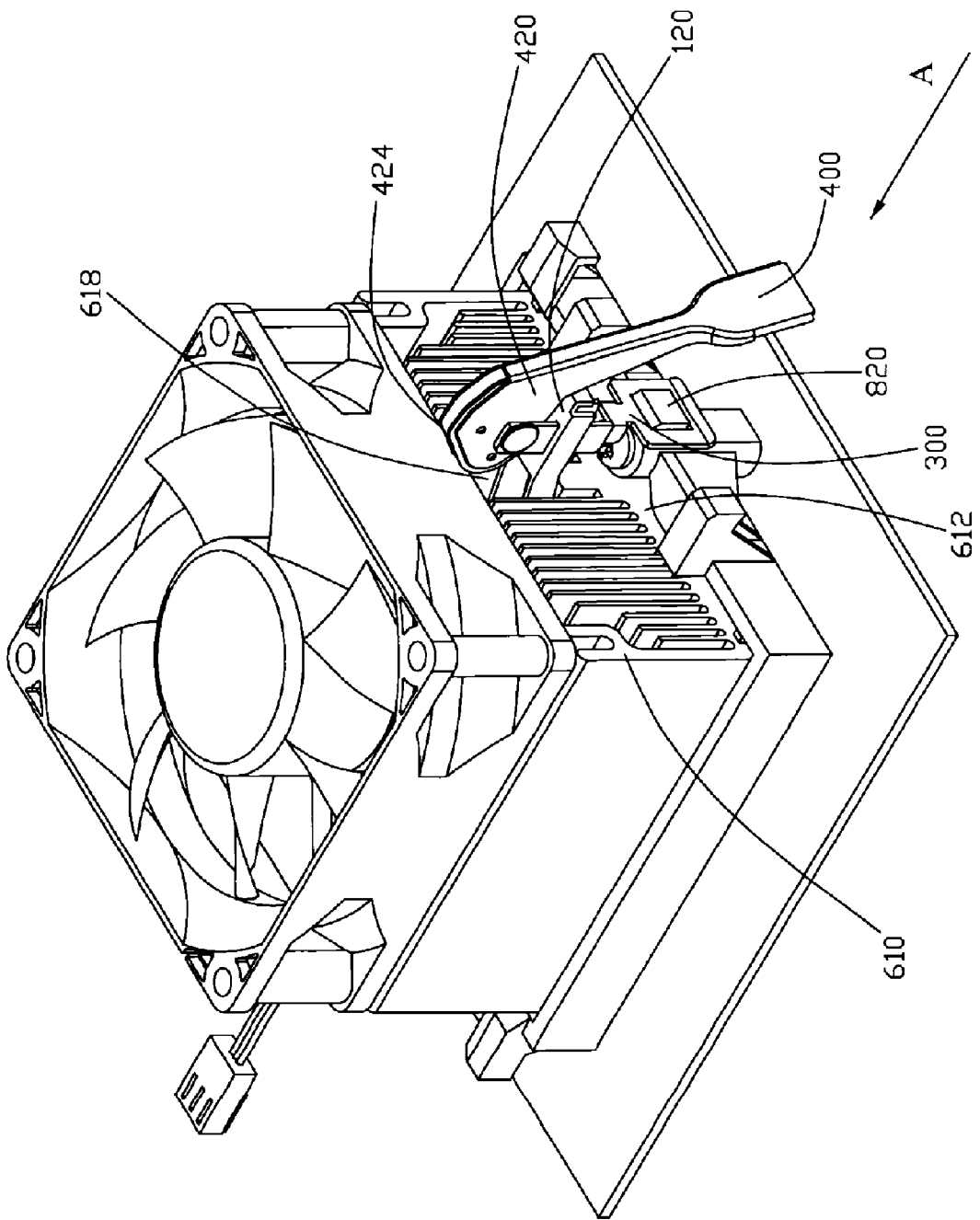
FIG. 4 is an assembly view of the clip, the heat dissipation device and the electronic package in FIG. 3.
Figure 5:
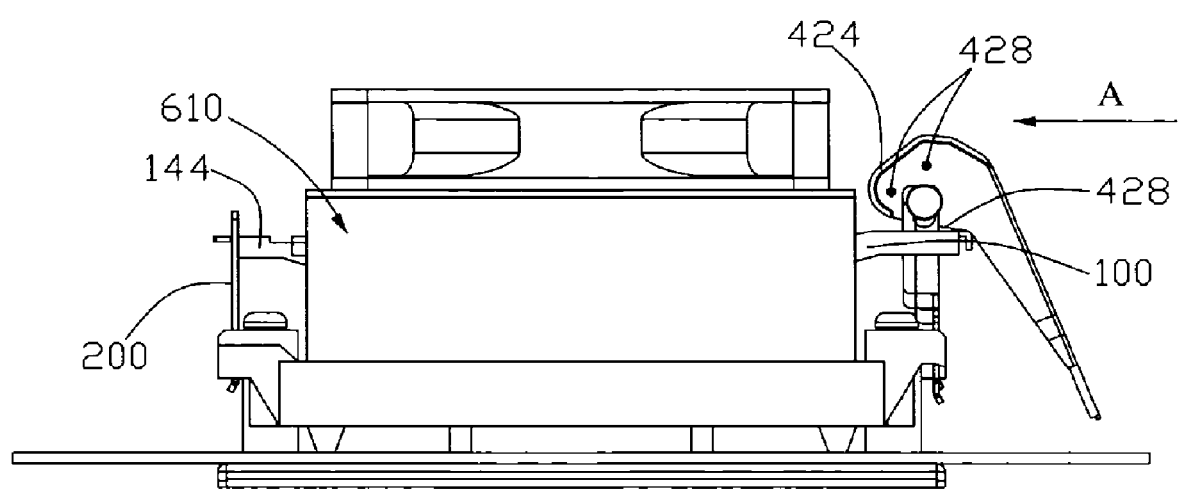
FIG. 5 is a side view of FIG. 4.
Figure 6:
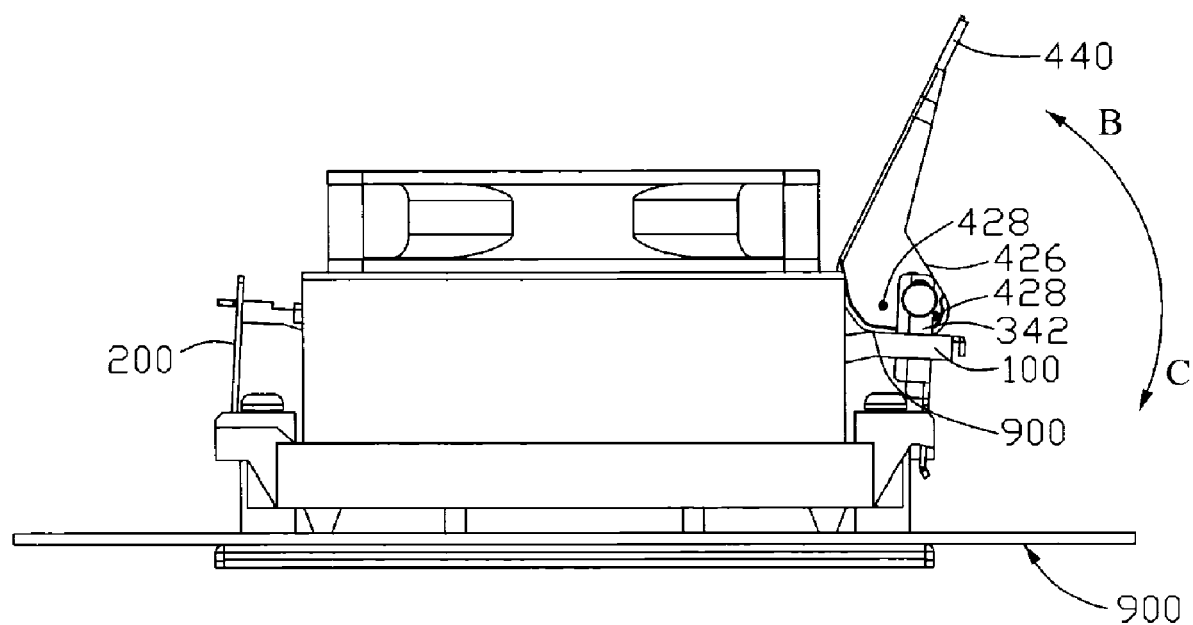
FIG. 6 is similar to FIG. 5, but shows an actuating member of the clip turned to a locked position.

When installing the clip into the heat dissipation device 600 which is pre-assembled, the first hook plate 200 is first detached from the body 100. Then, the body 100 of the clip is laterally inserted to the passage 618 from one side of the heat sink 610 along a direction A as shown in FIGS. 4-5, and the barbs 144 of the clip are exposed in an opposite side of the heat sink 610. Coupling the first hook plate 200 to the barbs 144, thus the clip is positioned on the base 612 of the heat sink 610. The hook hole 240 of the first hook plate 200 is then hung on a catch 810 at one side of the retention module 800. The hook hole 320 of the second hook plate 300 is subsequently forced into engagement with another catch 820 at opposite side of the retention module 800. Then the handle lever 440 is turned by hand from the unlocked position to the locked position as indicated by direction B of FIG. 6 to force the engagement portion 424 of the cam 420 into close contact with the supporting portion 120 of the body 100. At the same time, the legs 342 of the second hook plate 300 are located between the two nubs 428 of the cam 420 of the actuating member 400 with a one right of the two nubs 428 engaging with a corresponding leg 340. This can prevent the actuating member 400 from spontaneously returning to the unlocked position, unless the actuating member 400 is driven to rotate by a user in a direction as shown by direction C of FIG. 6. Therefore, the clip stably secures the heat dissipation device 600 onto the CPU module 700.

When installed, the hook holes 240, 320 of the first and second hook plates 200, 300 receive their respective catches 810, 820 of the retention module 800 therein. When set in the locked position, the body 100 is deformed and imparts a downward pressure onto the heat sink 610 keeping the bottom surface of the heat sink 610 in close contact with the top surface of the CPU module 700.

When removing the clip from the heat dissipation device 600, the actuating member 400 is forced to slide past the right nub 428 of the cam 420, and driven to rotate from the locked position to the unlocked position along the direction C. In this process, the engagement portion 424 of the cam 420 is moving away from the supporting portion 120 of the body 100 and the release portion 426 of the cam 420 is forced into contact with the supporting portion 120. The hook holes 240, 320 of the first and second hook plates 200, 300 are thereby disengaged from the constraint of the corresponding catches 810, 820 of the retention module 800. Then the first hook plate 200 is detached from the body 100 by pulling the clip out of the passage 618 along a direction opposite the direction A. Therefore, the clip is removed away from the heat dissipation device 600 and the heat dissipation device 600 is easily removed away from the CPU module 700 at the same time. During the detachment, a clamping force can be applied to the barbs 144 to force them moving toward each other, whereby the engagement between the barbs 144 and the first hook plate 200 can be released.

As described above, the first hook plate 200 is detachable from the body 100 of the clip, which makes it easy to install the clip into or remove the clip from the heat dissipation device 600, particularly when the fan 620 and the heat sink 610 is pre-assembled into a module.

Furthermore, the presence of the nubs 428 can prevent the actuating member 400 from rotating from the locked position caused by shocking or other reasons, which avails to stably secure the heat dissipation device 600 onto the CPU module 700.

In the preferred embodiment as described above, the two spaced arms 140 are interconnected with each other at opposite ends thereof via the supporting portion 120 and the bridge 142 of the body 100. However, in another embodiment, the bridge 142 can be omitted to improve the movableness of the barbs 144, whereby the detachment of the barbs 144 from the first hook plate 200 can be more easily achieved. Furthermore, the omission of the bridge 142 can improve the currency of the clip; thus, the clip can be used in different types of heat dissipation devices.

Figure 7:
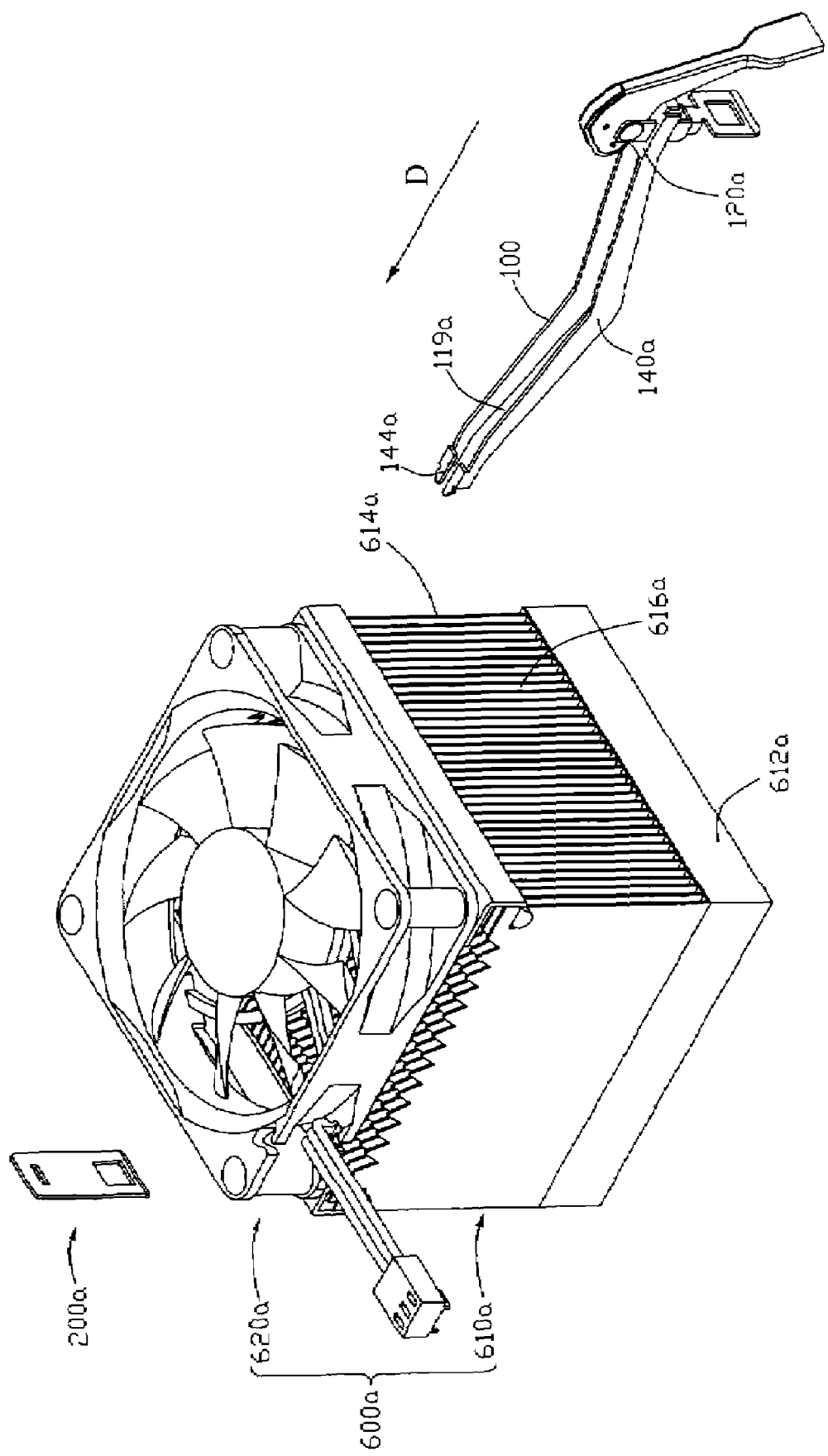
FIG. 7 illustrates a process of installing a clip into a heat dissipation device in accordance with another preferred embodiment of the present invention.
Figure 8:
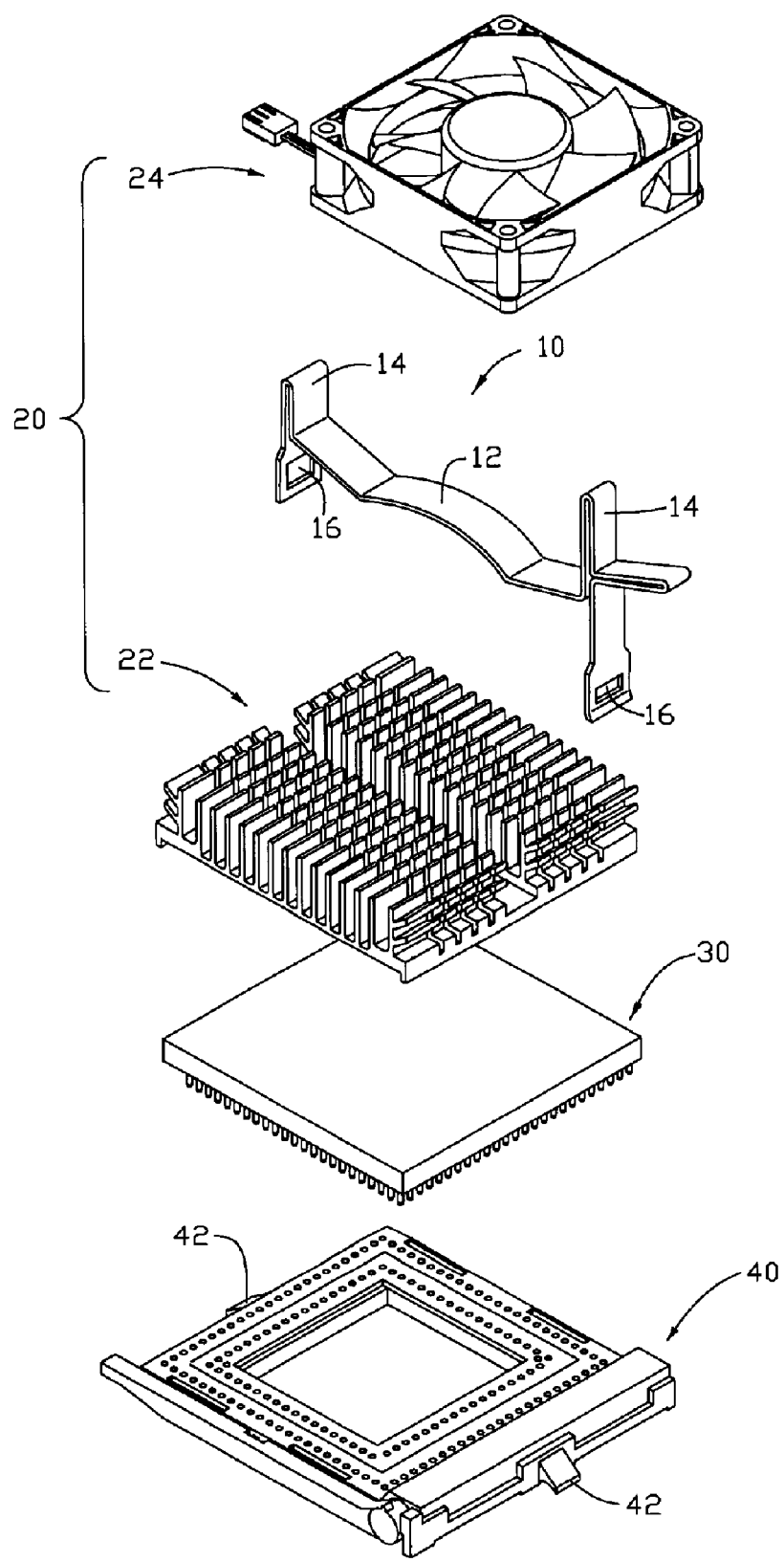
FIG. 8 is a perspective view of a clip in accordance with related art, together with a heat dissipation device and an electronic package.

For an example shown in FIG. 7, the spaced arms 140a are interconnected with each other only at one end thereof via the supporting portion 120a, and a path 119a is defined between the two arms 140a. The path 119a is used for a plate member, particularly a fin of a heat sink laterally sliding into between the arms 140a along a direction which the arms 140a extend along.

FIG. 7 illustrates the process of installing the clip into another heat dissipation device. The heat dissipation device 600a comprises a heat sink 610a and a fan 620a pre-assembled on an upper side of the heat sink 610a. The heat sink 610a comprises a base 612a and a plurality of fins 614a extending upwards from a top surface of the base 612a at a uniform interval. A plurality of airflow passages 616a are defined between adjacent fins 614a for an airflow produced by the fan 620a flowing past the heat sink 610a. When installing the clip into the heat dissipation device 600a, the two spaced arms 140a of the clip are respectively laterally inserted into two corresponding airflow passages 616a of the heat sink 610a, until the barbs 144a of the body 100a are exposed in an opposite side of the heat sink 610a. Then, the barbs 144a are engagingly inserted into the retaining hole (not labeled) of the first hook plate 200a, and the clip can secure the heat dissipation device 600a onto the CPU module according to the same method as described above. When assembled, the arms 140*a* are oriented parallel to or parallel abutting against the corresponding fins 614*a* of the heat sink 610*a*.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A clip, comprising:
   a body comprising a supporting portion and a pair of spaced arms extending from opposite sides of the supporting portion and interconnecting with each other only at one end of the body via the supporting portion;
   an actuating member having a cam supported on the supporting portion;
   a first hook plate detachably coupled to a distal end of the arms of the body; and
   a second hook plate extending through the supporting portion and pivotally coupled to the cam of the actuating member; wherein the actuating member is turnable relative to the second hook plate between a locked position and an unlocked position.

2. The clip as claimed in claim 1, wherein each arm comprises a barb formed at the distal end thereof for coupling the body to the first hook plate.

3. The clip as claimed in claim 2, wherein a retaining hole is defined in the first hook plate for engaging with the barbs of the body, and a hook hole is defined in the first hook plate for mounting.

4. The clip as claimed in claim 1, wherein a slot is defined through the supporting potion of the body along a direction parallel to the arms for the second hook extending therethrough.

5. The clip as claimed in claim 1, wherein the arms are substantially V-shaped.

6. The clip as claimed in claim 1, wherein the second hook plate comprises a leg extending through the supporting portion of the body.

7. The clip as claimed in claim 6, wherein two spaced nubs are formed at one side surface of the cam, wherein when the actuating member is at the locked position, one of the two nubs engages the leg to prevent the actuating member from spontaneously returning to the unlocked position.

8. The clip as claimed in claim 1, wherein a path is defined between the arms adapted for a fin of a heat sink sliding into the arms along a direction which the arms extend along.

9. A heat dissipation device assembly, comprising:
   a heat dissipation device comprising:
   a heat sink comprising a base in thermal contact with an electronic component and a plurality of fins on the base, at least a passage being defined in the fins;
   a fan mounted on an upper side of the heat sink;
   a clip attached to and securing the heat dissipation device onto the electronic component, the clip comprising:
   a body comprising a supporting portion and a pair of spaced arms extending from opposite sides of the supporting portion through the at least a passage of the heat sink and interconnecting with each other only at one end of the body via the supporting portion;
   an actuating member having a cam supported on the supporting portion;
   a first hook plate detachably coupled to an end of the arms of the body distant from the supporting portion;
   a second hook plate extending through the supporting portion of the body and pivotally coupled to the cam of the actuating member, wherein the actuating member is turnable relative to the second hook plate between a locked position and an unlocked position;
   wherein when the clip is to be detached from the heat dissipation device, the first hook plate is firstly decoupled from the distant end of the arms before the arms are withdrawn from the at least a passage of the heat sink.

10. The heat dissipation device assembly as claimed in claim 9, wherein the at least a passage comprises a plurality of airflow passages defined between adjacent fins, an air flow generated by the fan flowing through the airflow passages.

11. The heat dissipation device assembly as claimed in claim 9, wherein a locating protrusion is formed at a top surface of the base and is lower than adjacent fins so as to form the at least a passage under the fan and above the locating protrusion.

12. The clip as claimed in claim 9, wherein the second hook plate comprises a leg extending through the supporting portion of the body.

13. The clip as claimed in claim 12, wherein two spaced nubs are formed at one side surface of the cam, wherein when the actuating member is at the locked position, the leg of the second hook plate engages with one of the nubs to prevent the actuating member from spontaneously returning to the unlocked position.

* * * * *